United States Patent [19]
Schicht et al.

[11] Patent Number: 5,512,152
[45] Date of Patent: Apr. 30, 1996

[54] PROCESS FOR PREPARATION OF STABILIZED OXIDE THIN LAYERS

[75] Inventors: Heinz Schicht, Bethau; Herbert Schindler, Torgau; Klaus Januschkewitz, Recklinghausen; Werner Gregorowius, Köln; Wilfried Kaiser, Torgau, all of Germany

[73] Assignee: Saint Gobain Vitrage, Courbevoie, France

[21] Appl. No.: 275,520

[22] Filed: Jul. 15, 1994

[30] Foreign Application Priority Data

Jul. 15, 1993 [DE] Germany .................... 43 23 654.5

[51] Int. Cl.$^6$ .................... C23C 14/34; B05D 3/06; B05D 5/06
[52] U.S. Cl. .................... 204/192.26; 204/192.16; 204/192.22; 204/192.23; 204/192.25; 204/129.29; 427/553; 427/557; 427/165; 427/166; 427/167
[58] Field of Search .................... 204/192.15, 192.22, 204/192.23, 192.25, 192.26, 192.27, 192.28, 192.29, 192.16; 427/532, 542, 553, 557, 595, 126.2, 126.3, 165, 166, 167, 160

[56] References Cited

U.S. PATENT DOCUMENTS

| | | | |
|---|---|---|---|
| 4,447,473 | 6/1984 | Mashida et al. | 427/162 |
| 4,497,700 | 2/1985 | Groth et al. | 204/192.27 |
| 4,842,705 | 6/1989 | Mueller | 204/192.29 |
| 5,229,194 | 7/1993 | Lingle et al. | 204/192.26 |
| 5,264,077 | 11/1993 | Fukui et al. | 204/192.29 |

FOREIGN PATENT DOCUMENTS 57-124240  8/1982  Japan .

*Primary Examiner*—R. Bruce Breneman
*Assistant Examiner*—Rodney G. McDonald
*Attorney, Agent, or Firm*—Oblon, Spivak, McClelland, Maier & Neustadt

[57] ABSTRACT

A method for improving the quality of a system of layers deposited on a substrate such as glass is provided, in which, the system of layers have an oxide-based surface layer, in particular n-type semi-conductor oxides such as $SnO_x$, in which the surface layer is subjected to IR irradiation to provide a stabilization of the layer equivalent to or better than with a 48-hour exposure to the air.

10 Claims, No Drawings

PROCESS FOR PREPARATION OF STABILIZED OXIDE THIN LAYERS

BACKGROUND OF THE INVENTION

1. Field of the Invention

The present invention relates to a process for preparation of one or more metallic oxide thin layers on a substrate which provides improved surface properties and improved stabilization of these layers, and to the layered structures formed thereby.

2. Discussion of the Background

The use of vacuum deposition techniques is known to provide thin layer systems which are often inadequate with respect to their mechanical and chemical behavior. These inadequacies are observed particularly in systems which comprise one or several layers of an n-type semi-conductor metallic oxide, such as tin-oxide-based layers. One cause for such increased sensitivity of the surface layers can be found in the use of a reactive cathodic sputtering process (also known as cathodic pulverization) when the ratio of argon and oxygen in the reaction gas exceeds a certain value or when the gases contain traces of water or hydrocarbon. Such contamination cannot always be avoided in industrial installations.

It is known that the mechanical or chemical behavior of thin layer systems can be improved with the aid of a stabilization treatment. In DD-B-272 971, a process for stabilization of the surface metallic oxide layer by means of air treatment with oxygen-saturated water is described. The improvement in performance thus obtained is thought to occur through the depletion of interstitial oxygen molecules in the surface oxide layer.

In accordance with another known process described in DD-B-281 819, thin layer systems comprising an oxide as a surface layer are stabilized by means of a treatment in aqueous solutions of chromates, dichromates or permanganates. Here, again, the improvement in performance of the layer systems is accounted for by an oxygen depletion of the surface layer.

SUMMARY OF THE INVENTION

One object of the present invention is to provide a process for improving the performance of surface oxide layers, which will be simple to implement and which, in particular, can be integrated into conventional manufacturing processes.

A further object of the present invention is to provide a process for improving the chemical and mechanical properties of systems having metallic oxide surface layers on a substrate, which does not require a lengthy air curing treatment.

These and other objects of the present invention have been satisfied by the discovery of a process for preparing a stabilized thin layer coated substrate comprising depositing a metallic oxide surface layer onto a surface of a substrate by vacuum deposition; and irradiating said metallic oxide surface layer with infrared radiation.

DETAILED DESCRIPTION OF THE PREFERRED EMBODIMENTS

The present invention relates to a process for preparation of a stabilized thin layer coated substrate comprising depositing a metallic oxide surface layer onto a surface of a substrately deposition; and irradiating said metallic oxide surface layer with infrared radiation, and the layered structures formed thereby.

In performing the process of the present invention, the vacuum deposition step can be performed by a conventional vacuum deposition process, such as those outlined in Kirk-Othmer's *Encyclopedia of Chemical Technology*, vol. 15, pp. 264–265 (1981), which is hereby incorporated by reference. Particularly preferred in the process of the present invention is the use of conventional cathodic sputtering to deposit the one or more metallic oxide layers.

As a substrate for the process of the present invention, any conventional substrate used in vacuum deposition of metallic oxide thin layers may be used, with substrates such as glass, metals or semimetals being preferred and glass being more preferred. Most preferred among the substrates suitable for use in the present process is float glass.

The metallic oxide of the present invention includes $SnO_x$ or an n-type semi-conductor oxide or a member belonging to the group consisting of the oxides of silicon, aluminum, magnesium, zirconium, niobium, zinc, tantalum and titanium.

Following the deposition of the metallic oxide layer(s), a stabilization step is performed. The stabilization procedure may include any of the conventional stabilization steps used in this field, but must also necessarily include irradiation by infrared radiation. A preferred embodiment of the present invention requires the use of infrared irradiation immediately following manufacture, as opposed to later after a period of storage time. The infrared radiation used in the present process is preferably at a wave length ranging from 1.5 μm to 5 μm most preferably at a wave length adjusted at about 2.5 μm.

The level of energy used in the infrared radiation step can be varied considerably, so long as the desired stabilization effect is obtained. Preferably the energy used in the treatment should total at least 180 $kJ/m^2$ and at most 5400 $kJ/m^2$. Depending on the duration of the treatment, which preferably ranges from a few seconds to about 5 minutes, a surface intensity ranging from 1 $kW/m^2$ to 90 $kW/m^2$ is obtained. Preferably the choice of radiation intensity should be such that one avoids reaching substrate temperatures in excess of 100° C. In the case of a glass substrate, if this limit were exceeded, handling of the glass could become difficult, which would complicate the integration of the stabilization phase into the production process.

When the process of the present invention is put into operation at the conclusion of the vacuum deposition manufacturing process, it produces an appreciable improvement in the mechanical and chemical properties of the surface layer and/or the complete system of layers, as will be demonstrated with the aid of examples below.

Although the present inventors do not wish to be bound by a particular mechanism of action, one possible explanation for the success of the present treatment can be found in the fact that under the practical conditions of industrial production of metallic oxide thin layers, using a high sputtering rate and an equally substantial plasma density, the reaction is not stoichiometric. Thus, under the influence of the infrared radiation treatment of the present invention, a polycondensation reaction may be induced in the surface oxide layer which leads to a more substantial reticulation in the layer.

It is known that immediately at the conclusion of the cathodic sputtering process, the layers deposited on the glass sometimes are relatively sensitive, but their contact with the air leads to a beneficial process of aging which has the natural consequence of making the layers harder and less sensitive. This natural aging process takes several days and can take place only if the layer is in contact with the air. In conventional industrial production operations, the glass sheets on which the layers have been deposited are stacked up, generally near the installation outlet, and most often are packed immediately in an airtight manner which interrupts the contact of the layers with the air. The beneficial natural aging, therefore, cannot take place immediately; and in particular, the transport of the packages of glass sheets to the operating site occurs before improvement of the mechanical protects the sheets against damage in transport when vibrations impact mechanically on the layers.

The process of the present invention makes it possible to achieve stabilization under controlled conditions and in very brief time periods simply by the use of infrared radiation in the presence of air. Thus this additional phase may be introduced into the standard procedure without appreciably prolonging the production process. At the conclusion of the stabilization procedure, the surface layers have a perceptibly improved surface hardness so that, even if the sheets are immediately collected in packages where they are pressed against each other, the subsequent transport with its vibrations does not damage them.

Having generally described this invention, a further understanding can be obtained by reference to certain specific examples which are provided herein for purposes of illustration only and are not intended to be limiting unless otherwise specified.

EXAMPLES

In the examples which follow, a system of low-emissivity layers is provided on sheets of float glass wherein the layers comprise an $SnO_x$-based surface layer, deposited by reactive cathodic sputtering aided by a magnetic field.

To evaluate the quality of a layer system, a method using "the angle of connection" (or contact angle) such as appears in the work "Physikalische Chemie der Glasoberfläiche," Deutscher Verlag für Grundstoffindustrie, Leipzig, 1981, is used. The angle of connection is the angle which a liquid forms upon contact with the surface of a solid, and provides qualitative indications concerning the composition, structure and morphology of the surface of the solid and in particular of the glass. This makes it possible to draw conclusions regarding surface modifications and even regarding the behavior of the layers deposited on the glass.

In another connection, a nitric acid test is used to assess the chemical resistance of the layers. In the latter, a drop of $HNO_3$ (10 µl; semi-concentrated $HNO_3$) is deposited on the layer at a temperature of 21° C. After ten minutes, the diameter of the generally-circular corrosion stain which appears is measured. The smaller the diameter of this stain, the better the chemical stability of the layer.

COMPARATIVE EXAMPLE

On a sheet of float glass, there was deposited a low-emissivity layer with the composition:

Glass-$SnO^x$ (28 nm)-Ag (11 nm)-$CrNiO_x$ (4 nm) - $SnO_x$ (32 nm) using a transverse cathodic sputtering installation. At the line outlet, samples were taken immediately for measurement of the angle of connection and for the nitric acid test.

A sheet of the same glass with its low-emissivity layer was stored in the air for 48 hours. The same samples as above were then taken and tested.

At the end of 48 hours, a sheet which had been placed near the line outlet in the midst of a stack of identical sheets was removed. Identical samples then were cut out from this sheet.

The results of the angle of connection and the nitric acid tests in the three cases are provided in Table 1 below.

TABLE 1

|  | line outlet | 48 hours in air | 48 hours stacked |
| --- | --- | --- | --- |
| angle of connection (°) | 13 | 47 | 22 |
| nitric test (cm) | 1.2 | 0.9 | 1.1 |

The values obtained show that the procedure for natural aging and thus for improvement of the quality of the layer as it takes place when the layer is exposed to air for 48 hours is impeded when the sheet of glass is stacked in such a manner that the contact of the layer with the surrounding air is hindered.

EXAMPLE 1

After the same conventional production procedure as used in Comparative Example 1, infrared radiators having a maximum wavelength of 2.5 µm were installed at the outlet of the cathodic sputtering line and prior to entry into the automatic stacker. The radiation intensity was set at 18 $kW/m^2$, with the distance between the radiator and the glass surface having 120 mm.

Four different types of samples were taken: (1) directly at the line outlet prior to radiation treatment, (2) immediately following radiation treatment, (3) after storage in air for 48 hours, and (4) after a stacked storage for 48 hours. The same tests as performed above in Comparative Example 1 were conducted. The results were as follows:

|  | before irradiation | after irradiation | | |
| --- | --- | --- | --- | --- |
|  | line outlet | line outlet | 48 hours in air | 48 hours stacked |
| angle of connection (°) | 14 | 41 | 41 | 52 |
| nitric test (cm) | 1.1 | 0.9 | 0.95 | 0.8 |

The results of the tests show a clear improvement in the quality of the layer with the aid of infrared irradiation. The results are practically unchanged at the end of a 48-hour storage in air. Surprisingly, additional improvement at the end of a 48-hour storage in a stack has even been noted. This improvement after stacking even persisted after a further 48-hour storage of the same sample unstacked in the open air.

EXAMPLE 2

To evaluate the effect of the wavelength of the infrared radiation and its duration on the stabilization results, additional tests were undertaken on the same samples as described above. Ten samples were subjected to various conditions of infrared irradiation and each time, at the conclusion of irradiation, measurement of the angle of connection and the $HNO_3$ test were performed.

The results were as follows:

| sample | IR wave length (μm) | duration (min) | temperature of glass (°C.) | angle of connection | $HNO_3$ test (cm) |
|---|---|---|---|---|---|
| 1 | — | — | — | 13 | 1.3 |
| 2 | 2.5 | 0.5 | 39 | 27 | 1.2 |
| 3 | 2.5 | 1 | 52 | 31 | 0.9 |
| 4 | 2.5 | 1.5 | 67 | 31 | 0.9 |
| 5 | 2.5 | 2 | 75 | 30 | 1.0 |
| 6 | 3.4 | 0.5 | 41 | 22.5 | — |
| 7 | 3.4 | 1 | 54 | 26 | 1.2 |
| 8 | 3.4 | 1.5 | 60 | 26 | 1.1 |
| 9 | 3.4 | 2 | 85 | 26 | 1.2 |
| 10 | 1.8 | 0.5 | 38 | 26.5 | 1.2 |
| 11 | 1.6 | 1 | 54 | 28 | 1.2 |

The results show that stabilization is optimum when the maximum wave length of the infrared radiation is 2.5 μm, although considerable improvements are present over a range of wavelengths and durations.

The preceding examples all were carried out with a layer of tin oxide as the surface layer. For the person skilled in the art, however, it is clear that identical reactions occur for other metallic oxide layers which, like $SnO_x$, are likely to be under stoichiometrics because of production conditions and to possess interstitial oxygen or water molecules. These include, in particular, semi-conductor n-type, and especially silicon, aluminum, magnesium, zirconium, niobium, zinc, tantalum and titanium oxide based layers.

Depending on the conditions of deposition, the thin layers obtained with these oxides have water associated in a more or less significant amount. Under conditions of the present invention, reticulations of the same nature as those which are observed in tin oxide also occur, which lead to a stabilization of the layers.

What is claimed as new and is desired to be secured by Letters Patent of the United States is:

1. A process for preparing a stabilized layer-coated substrate, which comprises:
    a) depositing a metallic oxide surface layer onto a surface of a substrate by vacuum deposition; and
    b) irradiating said metallic oxide surface layer with infrared radiation, wherein said irradiation is effected using a wavelength and for a duration sufficient to impart an intensity of 1 $kW/m^2$ to 90 $kW/m^2$ thereto, and wherein said substrate is maintained at a temperature which does not exceed about 100° C.

2. The process of claim 1, wherein said infrared radiation has a wave length of from 1.5 μm to 5.0 μm.

3. The process of claim 1, wherein said irradiating step is performed immediately upon conclusion of said depositing step.

4. The process of claim 1, wherein said irradiating step has a duration of from 10 seconds to 5 minutes.

5. The process of claim 1, wherein said metallic oxide surface layer is $SnO_x$, or an n-type semi-conductor oxide selected from the group consisting of silicon oxide, aluminum oxide, magnesium oxide, zirconium oxide, niobium oxide, zinc oxide, tantalum oxide and titanium oxide.

6. The process according to claim 2, wherein said infrared radiation has a maximum wavelength of approximately 2.5 μm.

7. The process of claim 1, wherein said substrate is float glass.

8. The process of claim 1, wherein said depositing step is performed by cathodic sputtering.

9. The process of claim 1, wherein said substrate is maintained at a temperature in the range of about 38°–85° C.

10. The process of claim 1, wherein said deposited metallic oxide surface layer is tin oxide.

\* \* \* \* \*